US010508610B2

(12) United States Patent
Otsuji

(10) Patent No.: US 10,508,610 B2
(45) Date of Patent: Dec. 17, 2019

(54) SEMICONDUCTOR DEVICE AND FUEL INJECTIONS DEVICE

(71) Applicant: Renesas Electronics Corporation, Tokyo (JP)

(72) Inventor: Takashi Otsuji, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 350 days.

(21) Appl. No.: 15/643,348

(22) Filed: Jul. 6, 2017

(65) Prior Publication Data

US 2018/0058363 A1 Mar. 1, 2018

(30) Foreign Application Priority Data

Sep. 1, 2016 (JP) ................................ 2016-170473

(51) Int. Cl.

*F02D 41/24* (2006.01)
*G01R 19/04* (2006.01)
*F02D 41/20* (2006.01)
*F02M 51/06* (2006.01)
*F02D 41/28* (2006.01)

(52) U.S. Cl.

CPC ......... *F02D 41/2467* (2013.01); *F02D 41/20* (2013.01); *F02D 41/28* (2013.01); *F02M 51/061* (2013.01); *F02D 2041/2055* (2013.01); *F02D 2041/2058* (2013.01); *F02D 2041/286* (2013.01)

(58) Field of Classification Search

CPC ...... F02D 41/24; F02D 41/2467; F02D 41/28; F02D 41/20; F02D 2041/286; F02D 2041/2058; F02D 2041/2055; F02M 51/061; G01R 19/04; G01R 19/2506

See application file for complete search history.

(56) References Cited

U.S. PATENT DOCUMENTS 4,130,095 A * 12/1978 Bowler .............. F02D 41/2454 123/675
5,363,100 A * 11/1994 Bailey .................... G01R 19/04 341/118

(Continued)

FOREIGN PATENT DOCUMENTS

JP 2014-214837 A 11/2014

*Primary Examiner* — Son T Le

(74) *Attorney, Agent, or Firm* — McGinn IP Law Group, PLLC

(57) ABSTRACT

A semiconductor device has a peak value storage register, a threshold value storage register, a peak determination circuit, and an end timing determination circuit. The peak determination circuit determines whether or not to update a value stored in the peak value storage register. Further, the peak determination circuit ends an operation if the end timing determination circuit determines that an end timing has arrived. The peak value storage register updates a storage value if the peak determination circuit determines to perform updating. The end timing determination circuit determines that the end timing of the operation of the peak determination circuit has arrived if the value of an input signal becomes smaller than a value obtained by decreasing or increasing the value stored in the peak value storage register by a value corresponding to a threshold value stored in the threshold value storage register.

8 Claims, 8 Drawing Sheets

10

(56) References Cited

U.S. PATENT DOCUMENTS

| | | | | | |
|---|---|---|---|---|---|
| 5,796,232 | A * | 8/1998 | Alberter | G01P 3/481 | |
| | | | | 318/653 | |
| 6,208,173 | B1 * | 3/2001 | Redman-White | G01R 19/04 | |
| | | | | 327/59 | |
| 2016/0076498 | A1 | 3/2016 | Aono et al. | | |

* cited by examiner

7 / 8

SEMICONDUCTOR DEVICE AND FUEL INJECTIONS DEVICE

CROSS-REFERENCE TO RELATED APPLICATIONS

The disclosure of Japanese Patent Application No. 2016-170473 filed on Sep. 1, 2016 including the specification, drawings and abstract is incorporated herein by reference in its entirety.

BACKGROUND

The present invention relates to a semiconductor device and a fuel injection device, and more particularly, to a semiconductor device and a fuel injection device that determine the peak value of a signal.

In recent years, various studies have been advanced in engine control of an automobile or the like for the purpose of real-time optimization of fuel consumption performance and engine output. For example, for the detection of a fuel injection timing or a fuel injection amount in a fuel injection device (injector), the peak (including a peak value and a peak occurrence timing) of the drive current value or drive voltage value of the injector is detected in real time. Further, feedback to the next fuel injection control is performed in accordance with the injection timing or the fuel injection amount specified by the peak.

With regard thereto, for example, Japanese Unexamined Patent Publication No. 2014-214837 (Patent Document 1) discloses the correction of an injection pulse for the drive control of the fuel injection device by the detection of the peak of the drive current value or the drive voltage value.

SUMMARY

In the mechanical structure of the injector, a plurality of peaks can occur in the drive current within several tens to hundreds of microseconds in a valve opening operation at the start of fuel injection and a valve closing operation at the end of fuel injection. Further, the number of peaks that occur within a predetermined time period and their occurrence timings are not known in advance. In such a case, there is a possibility that a peak value holding circuit cannot hold the peak value of a peak that has first occurred.

The other problems and novel features will become apparent from the description of this specification and the accompanying drawings.

According to one embodiment, a semiconductor device has a peak value storage register, a threshold value storage register, a peak determination circuit, and an end timing determination circuit. The peak determination circuit determines whether or not to update a value stored in the peak value storage register. Further, the peak determination circuit ends an operation if the end timing determination circuit determines that an end timing has arrived. The peak value storage register updates a storage value if the peak determination circuit determines to perform updating. The end timing determination circuit determines that the end timing of the operation of the peak determination circuit has arrived if the value of an input signal becomes smaller than a value obtained by decreasing or increasing the value stored in the peak value storage register by a value corresponding to a threshold value stored in the threshold value storage register.

According to the one embodiment, the peak value holding circuit can surely hold the peak that has first occurred.

DETAILED DESCRIPTION

Figure 1:
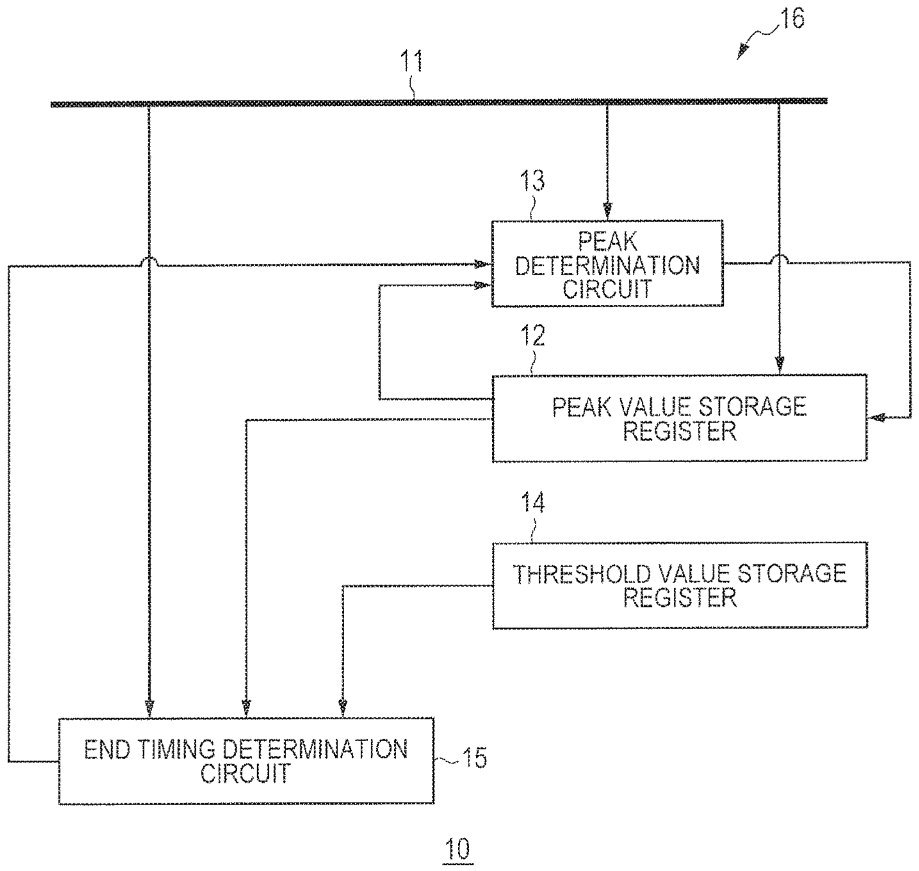
FIG. 1 is a block diagram showing an example of the configuration of a semiconductor device 10 according to the outline of embodiments.

To clarify the explanation, appropriate omission and simplification are made in the following description and drawings. In the drawings, the same elements are denoted by the same reference numerals, and their explanation will not be repeated as necessary.

OUTLINE OF EMBODIMENTS

First, the outline of embodiments will be described before describing the details of embodiments. FIG. 1 is a block diagram showing an example of the configuration of a semiconductor device 10 according to the outline of embodiments. The semiconductor device 10 includes a peak value holding circuit 16 having an input signal line 11, a peak value storage register 12, a peak determination circuit 13, a threshold value storage register 14, and an end timing determination circuit 15.

The input signal line 11 is a signal line through which an input signal is continuously inputted. For example, an input signal obtained by A/D-converting a current or the like is inputted.

The peak value storage register 12 is a register electrically coupled to the input signal line 11, and is a register for storing the peak value of the input signal. Further, the peak value storage register 12 is electrically coupled to the peak determination circuit 13 and the end timing determination circuit 15. If an update trigger signal is inputted from the peak determination circuit 13, the peak value storage register 12 updates a storage value to the value of the input signal inputted from the input signal line 11. That is, if the peak determination circuit 13 determines to perform updating, the peak value storage register 12 newly stores the value of the input signal compared by the peak determination circuit 13 at the time of the determination.

The peak determination circuit 13 determines the peak value. The peak determination circuit 13 is electrically coupled to the input signal line 11, and also electrically coupled to the peak value storage register 12 and the end timing determination circuit 15. The peak determination circuit 13 determines at least either a local maximum value or a local minimum value as the peak value. At this time, the peak determination circuit 13 compares the value stored in the peak value storage register 12 with the value of the input signal inputted from the input signal line 11, and determines based on a comparison result whether or not to update the value stored in the peak value storage register 12.

More specifically, in the case where the peak determination circuit 13 determines the local maximum value as the peak value, if the value of the input signal inputted from the input signal line 11 is larger than the value stored in the peak value storage register 12, the peak determination circuit 13 outputs the update trigger signal for updating the value stored in the peak value storage register 12 to the peak value storage register 12. Alternatively, in the case where the peak determination circuit 13 determines the local minimum value as the peak value, if the value of the input signal inputted from the input signal line 11 is smaller than the value stored in the peak value storage register 12, the peak determination circuit 13 outputs the update trigger signal to the peak value storage register 12.

If the end timing determination circuit 15 determines that an end timing has arrived, the peak determination circuit 13 ends an operation.

The threshold value storage register 14 stores a predetermined threshold value. Further, the threshold value storage register 14 is electrically coupled to the end timing determination circuit 15.

The end timing determination circuit 15 is electrically coupled to the input signal line 11, and also coupled to the peak value storage register 12, the threshold value storage register 14, and the peak determination circuit 13. The end timing determination circuit 15 determines the end timing of the operation of the peak determination circuit 13, based on the value of the input signal inputted from the input signal line 11, the value stored in the peak value storage register 12, and the threshold value stored in the threshold value storage register 14.

More specifically, in the case of determining the local maximum value as the peak value, when the value of the input signal inputted from the input signal line 11 becomes smaller than a value obtained by decreasing the value stored in the peak value storage register 12 by a value corresponding to the threshold value stored in the threshold value storage register 14, the end timing determination circuit 15 determines that the end timing of the operation of the peak determination circuit 13 has arrived. For example, if $P_{tmp}$ denotes the value currently stored in the peak value storage register 12, and $P_{th}$ denotes the threshold value stored in the threshold value storage register 14, the end timing is determined as follows. When the value of the input signal inputted from the input signal line 11 becomes smaller than the calculated value of $(P_{tmp}+P_{th})$ ($P_{th}$ is a negative value), it is determined that the end timing has arrived. Alternatively, when the value of the input signal inputted from the input signal line 11 becomes smaller than the calculated value of $(P_{tmp}-P_{th})$ ($P_{th}$ is a positive value), it is determined that the end timing has arrived.

Similarly, in the case of determining the local minimum value as the peak value, when the value of the input signal inputted from the input signal line 11 becomes larger than a value obtained by increasing the value stored in the peak value storage register 12 by the value corresponding to the threshold value stored in the threshold value storage register 14, the end timing determination circuit 15 determines that the end timing of the operation of the peak determination circuit 13 has arrived. For example, when the value of the input signal inputted from the input signal line 11 becomes larger than the calculated value of $(P_{tmp}+P_{th})$ ($P_{th}$ is a positive value), it is determined that the end timing has arrived. Alternatively, when the value of the input signal inputted from the input signal line 11 becomes larger than the calculated value of $(P_{tmp}-P_{th})$ ($P_{th}$ is a negative value), it is determined that the end timing has arrived.

If the end timing determination circuit 15 determines that the end timing has arrived, the end timing determination circuit 15 outputs a signal for notifying the end of the operation to the peak determination circuit 13. When the peak determination circuit 13 receives this signal, the peak determination circuit 13 ends the operation. The signal for notifying the end of the operation can be a signal for notifying the end timing of the operation to the peak determination circuit 13, and may be the negation of a signal for permitting the operation (operation permission signal). The signal for notifying the end of the operation may be notified directly from the end timing determination circuit 15 to the peak determination circuit 13, or may be notified through another control circuit or the like as shown in the following embodiments.

Figure 2:
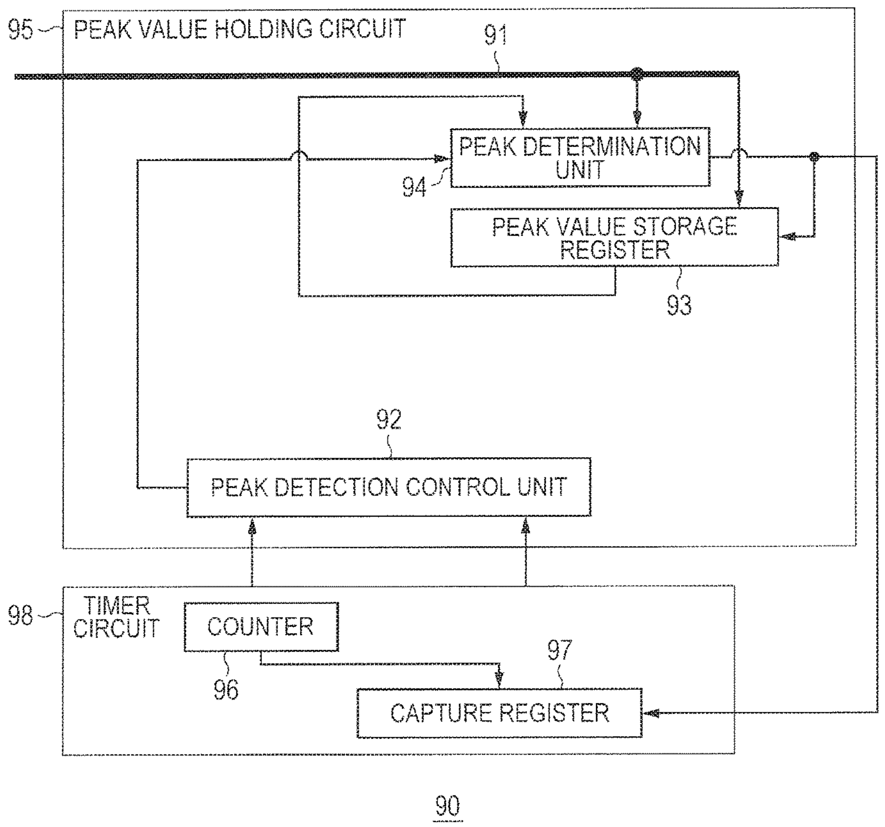
FIG. 2 is a block diagram showing an example of the configuration of a semiconductor device 90 according to a comparative example.

Next, to describe the features of the semiconductor device 10, a semiconductor device 90 according to a comparative example will be described. FIG. 2 is a block diagram showing an example of the configuration of the semiconductor device 90 according to the comparative example. The semiconductor device 90 includes a peak value holding circuit 95 having an input signal line 91, a peak detection control unit 92, a peak value storage register 93, and a peak determination unit 94. Further, the semiconductor device 90 includes a timer circuit 98 having a counter 96 and a capture register 97.

The peak detection control unit 92 is electrically coupled to the peak determination unit 94, and notifies the operation permission signal to the peak determination unit 94. More specifically, when the peak detection control unit 92 receives a detection section start trigger signal outputted from the timer circuit 98, the peak detection control unit 92 asserts the operation permission signal for the peak determination unit 94. Further, when the peak detection control unit 92 receives a detection section end trigger signal outputted from the timer circuit 98, the peak detection control unit 92 negates the operation permission signal for the peak determination unit 94.

The peak value storage register 93 is a register for storing the peak value of the input signal. If the update trigger signal is inputted from the peak determination unit 94, the peak value storage register 93 updates the storage value to the value of the input signal inputted from the input signal line 91. That is, if the peak determination circuit 94 determines to perform updating, the peak value storage register 93 newly stores the value of the input signal compared by the peak determination circuit 94 at the time of the determination.

The peak determination unit 94 determines the peak value, like the peak determination circuit 13. That is, like the peak determination circuit 13, the peak determination unit 94 compares the value stored in the peak value storage register 93 with the value of the input signal inputted from the input signal line 91, and determines based on a comparison result whether or not to update the value stored in the peak value storage register 93. Then, if the peak determination unit 94 determines to update the value stored in the peak value storage register 93, the peak determination unit

94 outputs the update trigger signal to the peak value storage register 93 and the capture register 97.

The counter 96 is, for example, a counter circuit for counting a time. The capture register 97 is a register for storing information indicating the acquisition timing of the peak value. When the capture register 97 receives the update trigger signal from the peak determination unit 94, the capture register 97 stores the count value of the counter 96. That is, the capture register 97 stores the value of the counter 96 at the occurrence of the peak update trigger signal. Thereby, the occurrence position of the peak is stored in the capture register 97.

Figure 3:
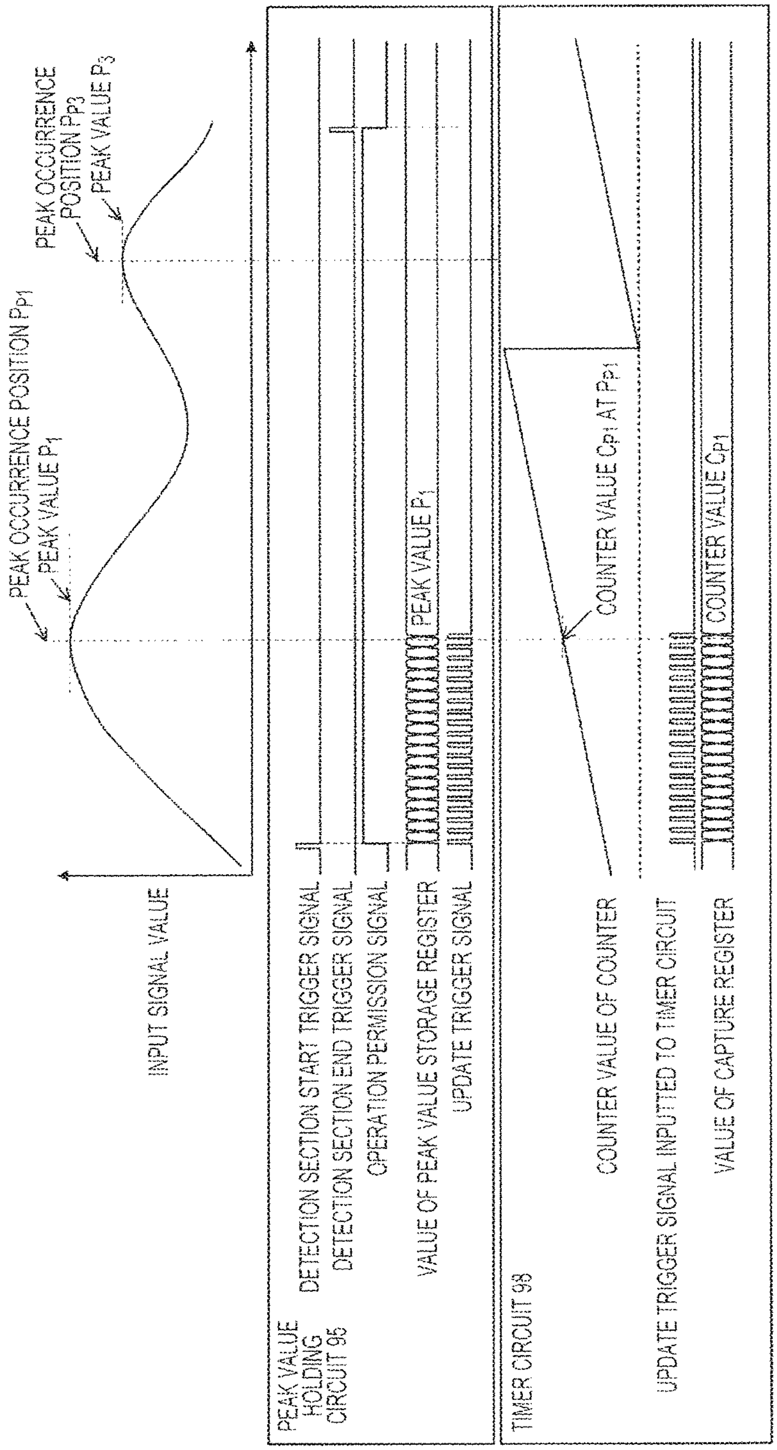
FIG. 3 is a timing chart showing an example of the operation of the semiconductor device 90 according to the comparative example.

FIG. 3 is a timing chart showing an example of the operation of the semiconductor device 90 according to the comparative example. As shown in FIG. 3, in the semiconductor device 90 according to the comparative example, during a time period from when the detection section start trigger signal is inputted to the peak detection control unit 92 till when the detection section end trigger signal is inputted to the peak detection control unit 92, the operation permission signal for the peak determination unit 94 remains asserted. Therefore, during this time period, the peak determination unit 94 continuously operates, and in the semiconductor device 90, a peak at one position in the detection section is acquired.

For example, in the case of detecting the local maximum value, if an input value is larger than the current storage value of the peak value storage register 93, the peak determination unit 94 outputs the update trigger signal. For example, in the case where there are local maximum values at peak occurrence positions $P_{P1}$ and $P_{P3}$ during the time period from when the detection section start trigger signal is inputted to the peak detection control unit 92 till when the detection section end trigger signal is inputted to the peak detection control unit 92, a value finally stored in the peak value storage register 93 is as follows. As shown in FIG. 3, if a peak value $P_1$ at the peak occurrence position $P_{P1}$ is larger than a peak value $P_3$ at the peak occurrence position $P_{P3}$, the peak value $P_1$ of the peak at the peak occurrence position $P_{P1}$ which is the first peak is finally stored in the peak value storage register 93. At this time, a count value $C_{P1}$ at the peak occurrence position $P_{P1}$ is finally stored in the capture register 97.

However, if the peak value $P_3$ is larger than the peak value $P_1$, the peak value $P_3$ of the peak at the peak occurrence position $P_{P3}$ in place of the peak value $P_1$ of the peak at the peak occurrence position $P_{P1}$ which is the first peak is finally stored in the peak value storage register 93. Further, a count value $C_{P3}$ at the peak occurrence position $P_{P3}$ is finally stored in the capture register 97. That is, according to the semiconductor device 90 according to the comparative example, there is a case where the peak value holding circuit cannot hold the peak that has first occurred.

Thus, in the case where a plurality of peaks exist in the detection section, there is a case where it is not possible to obtain the peak that has first occurred. On the other hand, for example, it is possible to acquire peak occurrence positions and peak values by software processing after acquiring all input values in the detection section. However, in this case, the first peak value and the peak occurrence position cannot be acquired until the detection section is ended. That is, it is not possible to acquire the peak in real time. Alternatively, if the peak occurrence position is known, it is possible to set the detection section for each peak occurrence position; however, if the peak occurrence position is not known, it is not possible to set the detection section in that way.

However, according to the semiconductor device 10, the peak determination circuit 13 ends the operation if the end timing determination circuit 15 determines that the end timing has arrived. That is, since the peak determination circuit 13 ends the operation when the end timing determination circuit 15 confirms that one peak has passed away, the peak value storage register 12 is not updated thereafter. Therefore, according to the semiconductor device 10, the peak value holding circuit can surely hold the peak that has first occurred.

DETAILS OF EMBODIMENTS

First Embodiment

Figure 4:
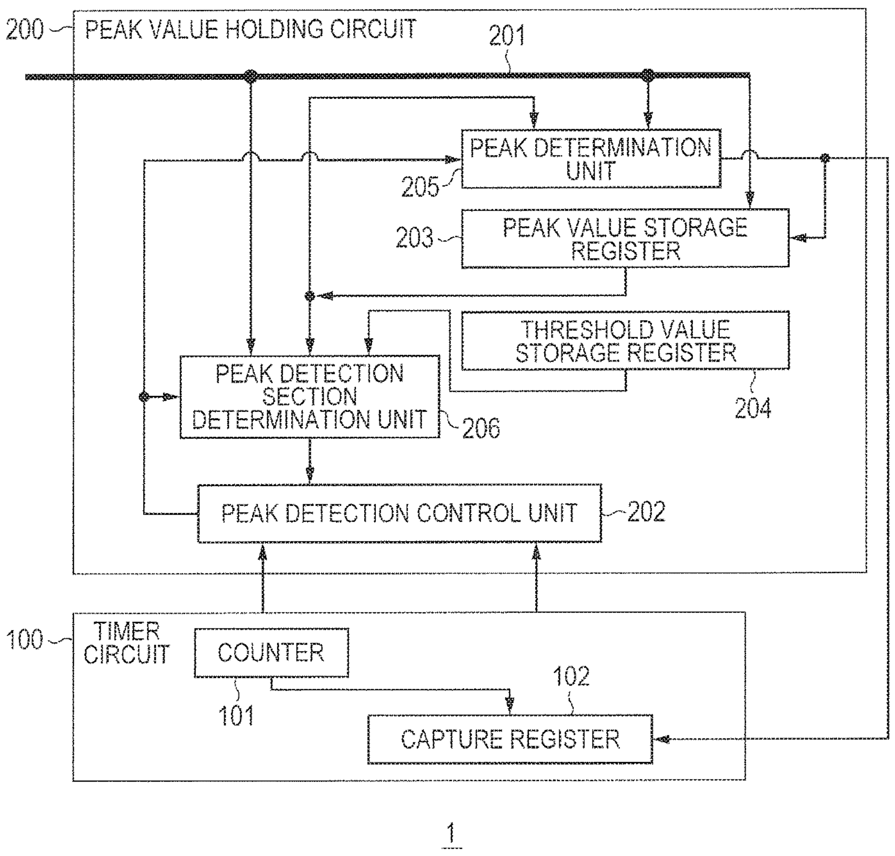
FIG. 4 is a block diagram showing an example of the configuration of a semiconductor device 1 according to a first embodiment.
Figure 5:
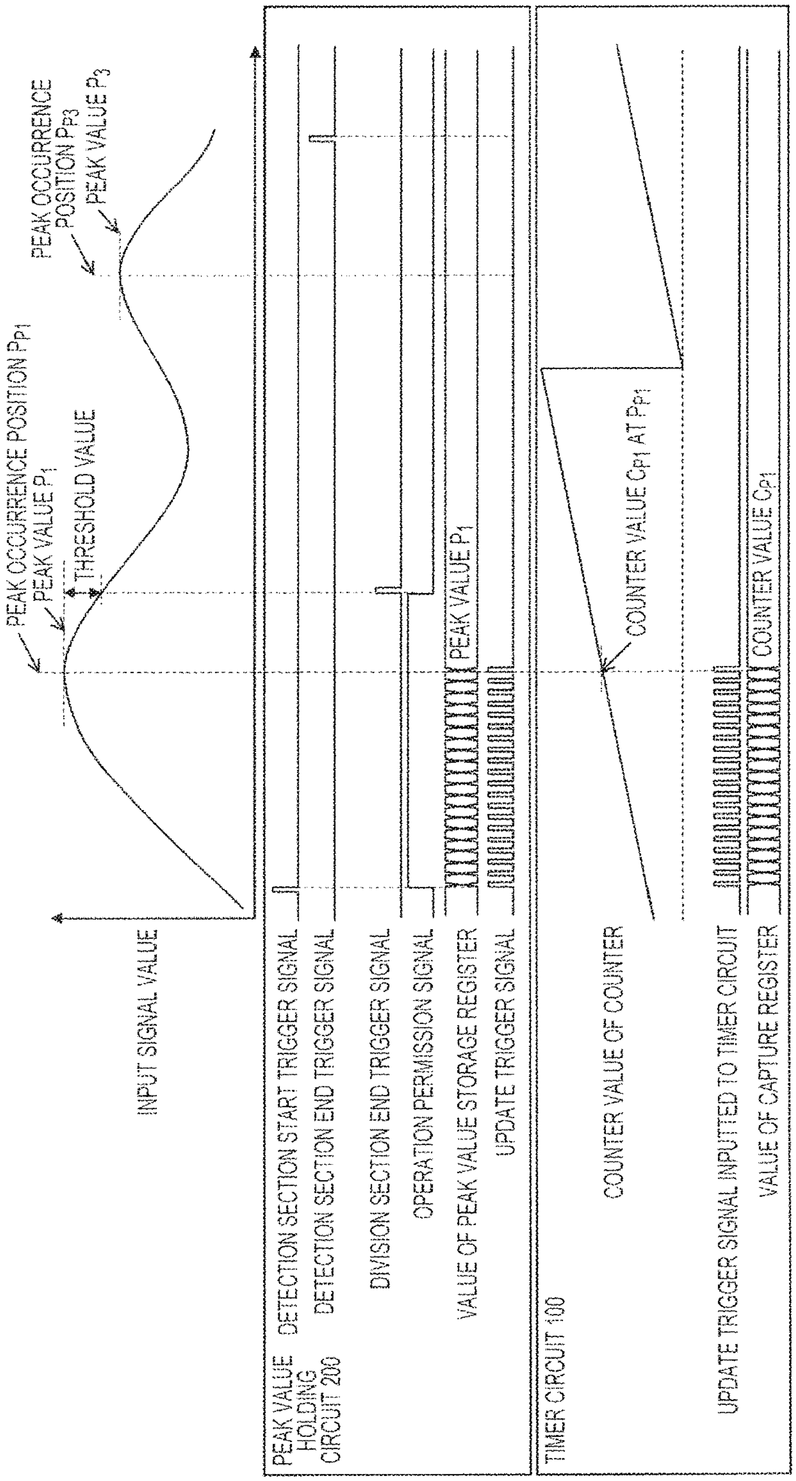
FIG. 5 is a timing chart showing an example of the operation of the semiconductor device 1 according to the first embodiment.

Next, the details of embodiments will be described. FIG. 4 is a block diagram showing an example of the configuration of a semiconductor device 1 according to the first embodiment. FIG. 5 is a timing chart showing an example of the operation of the semiconductor device 1 according to the first embodiment. Hereinafter, the semiconductor device 1 will be described with reference to FIGS. 4 and 5. As shown in FIG. 4, the semiconductor device 1 includes a timer circuit 100 and a peak value holding circuit 200.

The timer circuit 100 has a counter 101 and a capture register 102. The counter 101 is a counter circuit for counting a variable value that varies with the lapse of time. The counter 101 is, for example, a counter circuit for counting a time, and may be a rotation detector for counting an engine rotation angle.

The capture register 102 is a register for storing information indicating the acquisition timing of the peak value. If the update trigger signal is inputted from a peak determination unit 205 described later, the capture register 102 updates a storage value to a count value inputted from the counter 101. If the update trigger signal is not inputted from the peak determination unit 205, the capture register 102 does not perform updating, and continuously holds the current storage value. That is, the capture register 102 stores the value of the counter 101 at the occurrence of the peak update trigger signal. Thereby, the occurrence position of the peak is stored in the capture register 102. The capture register 102 is occasionally referred to as a timing storage register.

Next, the peak value holding circuit 200 will be described. As shown in FIG. 4, the peak value holding circuit 200 has an input signal line 201, a peak detection control unit 202, a peak value storage register 203, a threshold value storage register 204, a peak determination unit 205, and a peak detection section determination unit 206.

The input signal line 201 corresponds to the input signal line 11, and is a signal line through which the input signal is continuously inputted.

The peak detection control unit 202 is a control circuit for controlling the start and end of the operation of the peak determination unit 205, and can be simply referred to as a control circuit. The peak detection control unit 202 receives the detection section start trigger signal for instructing the start of a peak detection section and the detection section end trigger signal for instructing the end of the peak detection section. Further, the peak detection control unit 202 receives a division section end trigger signal for instructing the end of a division section in the detection section.

The peak detection control unit 202 controls the operations of the peak determination unit 205 and the peak detection section determination unit 206, based on the detection section start trigger signal and the detection section end trigger signal inputted from the timer circuit 100 and the division section end trigger signal inputted from the peak detection section determination unit 206. Therefore, the peak detection control unit 202 is electrically coupled to the timer circuit 100, the peak detection section determination unit 206, and the peak determination unit 205. The detection section start trigger signal and the detection section end trigger signal may be inputted from a circuit or the like (not shown) other than the timer circuit 100 to the peak detection control unit 202.

When the peak detection control unit 202 receives the detection section start trigger signal, the peak detection control unit 202 outputs the operation permission signal to the peak determination unit 205. That is, in this case, the peak detection control unit 202 asserts the operation permission signal for the peak determination unit 205 (sets the operation permission signal to 1). Further, when the peak detection control unit 202 receives the detection section end trigger signal, the peak detection control unit 202 outputs an operation inhibition signal to the peak determination unit 205. That is, in this case, the peak detection control unit 202 negates the operation permission signal for the peak determination unit 205 (sets the operation permission signal to 0). Therefore, it is possible to restrict the operation of the peak value holding circuit 200 within a desired detection section, regardless of the success or failure of peak detection. Further, when the peak detection control unit 202 receives the division section end trigger signal, the peak detection control unit 202 outputs the operation inhibition signal to the peak determination unit 205. That is, when the peak detection control unit 202 receives either the detection section end trigger signal or the division section end trigger signal, the peak detection control unit 202 outputs the operation inhibition signal to the peak determination unit 205. In other words, the peak detection control unit 202 outputs the operation inhibition signal to the peak determination unit 205 at the timing of occurrence of either the reception of the detection section end trigger signal or the determination of the end timing by the peak detection section determination unit 206.

Further, the peak detection control unit 202 performs the same signal output to the peak detection section determination unit 206 as the signal output to the peak determination unit 205. Thereby, the peak detection section determination unit 206 starts and ends the operation at the same timing as the peak determination unit 205.

The peak value storage register 203 corresponds to the peak value storage register 12. The peak value storage register 203 is a register electrically coupled to the input signal line 201, and is a register for storing the peak value of the input signal. Further, the peak value storage register 203 is electrically coupled to the peak determination unit 205 and the peak detection section determination unit 206. If the update trigger signal is inputted from the peak determination unit 205, the peak value storage register 203 updates the storage value to the value of the input signal inputted from the input signal line 201. If the update trigger signal is not inputted from the peak determination unit 205, the peak value storage register 203 does not perform updating, and continuously holds the current storage value.

The threshold value storage register 204 corresponds to the threshold value storage register 14, and stores a predetermined threshold value. The threshold value is a set value with which the peak detection section determination unit 206 described later accurately detects the end of one peak. Further, the threshold value storage register 204 is electrically coupled to the peak detection section determination unit 206.

The peak determination unit 205 corresponds to the peak determination circuit 13, and determines the peak value. The peak determination unit 205 is electrically coupled to the input signal line 201, and also electrically coupled to the peak value storage register 203, the capture register 102 of the timer circuit 100, and the peak detection control unit 202.

In the case where the peak determination unit 205 determines the local maximum value as the peak value, that is, in the case where the semiconductor device 1 is configured as a circuit for detecting the local maximum value, if the value of the input signal inputted from the input signal line 201 is larger than the value stored in the peak value storage register 203, the peak determination unit 205 outputs the update trigger signal for updating the value stored in the peak value storage register 203 to the peak value storage register 203 and the capture register 102. More specifically, if I denotes the input value of the signal inputted from the input signal line 201 to the peak determination unit 205 and $P_{tmp}$ denotes the value currently stored in the peak value storage register 203, the peak determination unit 205 determines whether or not the following equation (1) is true, and if true, the peak determination unit 205 outputs the peak update trigger signal.

$$I>P_{tmp} \quad (1)$$

In the case where the peak determination unit 205 determines the local minimum value as the peak value, that is, in the case where the semiconductor device 1 is configured as a circuit for detecting the local minimum value, if the value of the input signal inputted from the input signal line 201 is smaller than the value stored in the peak value storage register 203, the peak determination unit 205 outputs the update trigger signal to the peak value storage register 203 and the capture register 102. More specifically, the peak determination unit 205 determines whether or not the following equation (2) is true, and if true, the peak determination unit 205 outputs the peak update trigger signal.

$$I<P_{tmp} \quad (2)$$

The operation of the peak determination unit 205 is controlled by the peak detection control unit 202. The peak determination unit 205 starts the operation when the operation permission signal from the peak detection control unit 202 is inputted, and ends the operation when the operation inhibition signal from the peak detection control unit 202 is inputted. Referring to FIG. 5, the peak determination unit 205 continues the operation while the operation permission signal is asserted, and ends the operation when the operation permission signal is negated.

The peak detection section determination unit 206 corresponds to the end timing determination circuit 15. The operation of the peak detection section determination unit 206 is controlled by the peak detection control unit 202, like the peak determination unit 205. That is, the peak detection section determination unit 206 starts the operation when the operation permission signal from the peak detection control unit 202 is inputted, and ends the operation when the operation inhibition signal from the peak detection control unit 202 is inputted. Referring to FIG. 5, the peak detection section determination unit 206 continues the operation while the operation permission signal is asserted, and ends the operation when the operation permission signal is negated.

The peak detection section determination unit 206 is electrically coupled to the input signal line 201, and also coupled to the peak value storage register 203, the threshold value storage register 204, and the peak detection control unit 202. The peak detection section determination unit 206 determines a timing to interrupt the detection of the peak in the detection section, that is, the end timing of the operation of the peak determination unit 205. If the peak detection section determination unit 206 determines that the timing to interrupt the detection of the peak has arrived, the peak detection section determination unit 206 outputs the division section end trigger signal to the peak detection control unit 202.

More specifically, in the case where the peak determination unit 205 determines the local maximum value as the peak value, that is, in the case where the semiconductor device 1 is configured as a circuit for detecting the local maximum value, the peak detection section determination unit 206 determines whether or not the following equation (3) is true, and if true, the peak detection section determination unit 206 outputs the division section end trigger signal.

$$I<(P_{tmp}+P_{th}) \quad (3)$$

In the equation (3), $P_{th}$ is the threshold value stored in the threshold value storage register 204. Further, in the equation (3), $P_{th}$ is a negative value. The right side of the equation (3) is expressed as addition, but can be expressed as subtraction, with $P_{th}$ as a positive value.

Alternatively, in the case where the peak determination unit 205 determines the local minimum value as the peak value, that is, in the case where the semiconductor device 1 is configured as a circuit for detecting the local minimum value, the peak detection section determination unit 206 determines whether or not the following equation (4) is true, and if true, the peak detection section determination unit 206 outputs the division section end trigger signal.

$$I>(P_{tmp}+P_{th}) \quad (4)$$

In the equation (4), $P_{th}$ is a positive value. The right side of the equation (4) is expressed as addition, but can be expressed as subtraction, with $P_{th}$ as a negative value.

As described above, when the division section end trigger signal is outputted from the peak detection section determination unit 206, the peak detection control unit 202 ends the operation of the peak determination unit 205. Thereby, thereafter, even if there is an input value larger than the local maximum value stored in the peak value storage register 203, the contents of the peak value storage register 203 and the contents of the capture register 102 are not updated. Similarly, after the division section end trigger signal is outputted from the peak detection section determination unit 206, even if there is an input value smaller than the local minimum value stored in the peak value storage register 203, the contents of the peak value storage register 203 and the contents of the capture register 102 are not updated.

Referring to FIG. 5, an operation example of the semiconductor device 1 will be described. When the detection section start trigger signal is inputted to the peak detection control unit 202, the peak detection control unit 202 asserts the operation permission signal for the peak determination unit 205 and the peak detection section determination unit 206. Thereby, the peak determination unit 205 and the peak detection section determination unit 206 start the operations. The update trigger signal is outputted from the peak determination unit 205 until the first peak occurrence position $P_{P1}$ arrives, that is, the value of the input signal of the input signal line 201 becomes the peak value $P_1$. The values of the peak value storage register 203 and the capture register 102 are continuously updated while the update trigger signal is outputted. After the first peak occurrence position $P_{P1}$, the peak determination unit 205 does not output the update trigger signal, and the values of the peak value storage register 203 and the capture register 102 are not changed. Then, when the value of the input signal further decreases, the peak detection section determination unit 206 outputs the division section end trigger signal. When the division section end trigger signal is outputted, the peak detection control unit 202 negates the operation permission signal for the peak determination unit 205 and the peak detection section determination unit 206. That is, even before the detection section end trigger signal is generated, the peak detection control unit 202 negates the operation permission signal for the peak determination unit 205 and the peak detection section determination unit 206. Thereby, as the detection result of the first peak, the peak value $P_1$ remains stored in the peak value storage register 203, and the count value $C_{P1}$ corresponding to the peak occurrence position $P_{P1}$ remains stored in the capture register 102.

In the example shown in FIG. 5, the first local maximum value $P_1$ at the peak occurrence position $P_{P1}$ is larger than the second local maximum value $P_3$ at the peak occurrence position $P_{P3}$; however, even if the local maximum value $P_3$ is larger than the local maximum value $P_1$, the semiconductor device 1 can detect the first local maximum value $P_1$. That is, even if a plurality of local maximum values exist in the detection section, the semiconductor device 1 can detect the first local maximum value. Alternatively, in the case where the semiconductor device 1 detects the local minimum value, even if a plurality of local minimum values exist in the detection section, the semiconductor device 1 can detect the first local minimum value. Further, since the capture register 102 is provided, it is possible to acquire the occurrence position of the acquired peak value. Thus, according to the semiconductor device 1, it is possible to acquire the first peak in real time.

Further, since the peak is determined using the threshold value, fluctuation in the signal which cannot be regarded as the peak is prevented from being erroneously determined as the peak. The threshold value stored in the threshold value storage register 204 may be a ratio value with respect to the value stored in the peak value storage register 203. In this case, for the detection of the local maximum value, e.g., a negative percent value is set as the threshold value. The peak detection section determination unit 206 determines whether or not the following equation (5) is true, and if true, the peak detection section determination unit 206 outputs the division section end trigger signal.

$$I<(P_{tmp}\times(100\%+P_{th})) \quad (5)$$

Alternatively, for the detection of the local maximum value, e.g., a positive percent value may be set as the threshold value. In this case, the right side of the equation (5) is expressed as subtraction instead of addition.

For the detection of the local minimum value, e.g., a positive percent value is set as the threshold value. The peak detection section determination unit 206 determines whether or not the following equation (6) is true, and if true, the peak detection section determination unit 206 outputs the division section end trigger signal.

$$I>(P_{tmp}\times(100\%+P_{th})) \quad (6)$$

Alternatively, for the detection of the local minimum value, e.g., a negative percent value may be set as the threshold value. In this case, the right side of the equation (6) is expressed as subtraction instead of addition.

Thus, by setting the threshold value to the ratio value with respect to the value stored in the peak value storage register 203, it is possible to detect the peak, irrespective of the dynamic range of the value of the input signal.

Second Embodiment

Figure 6:
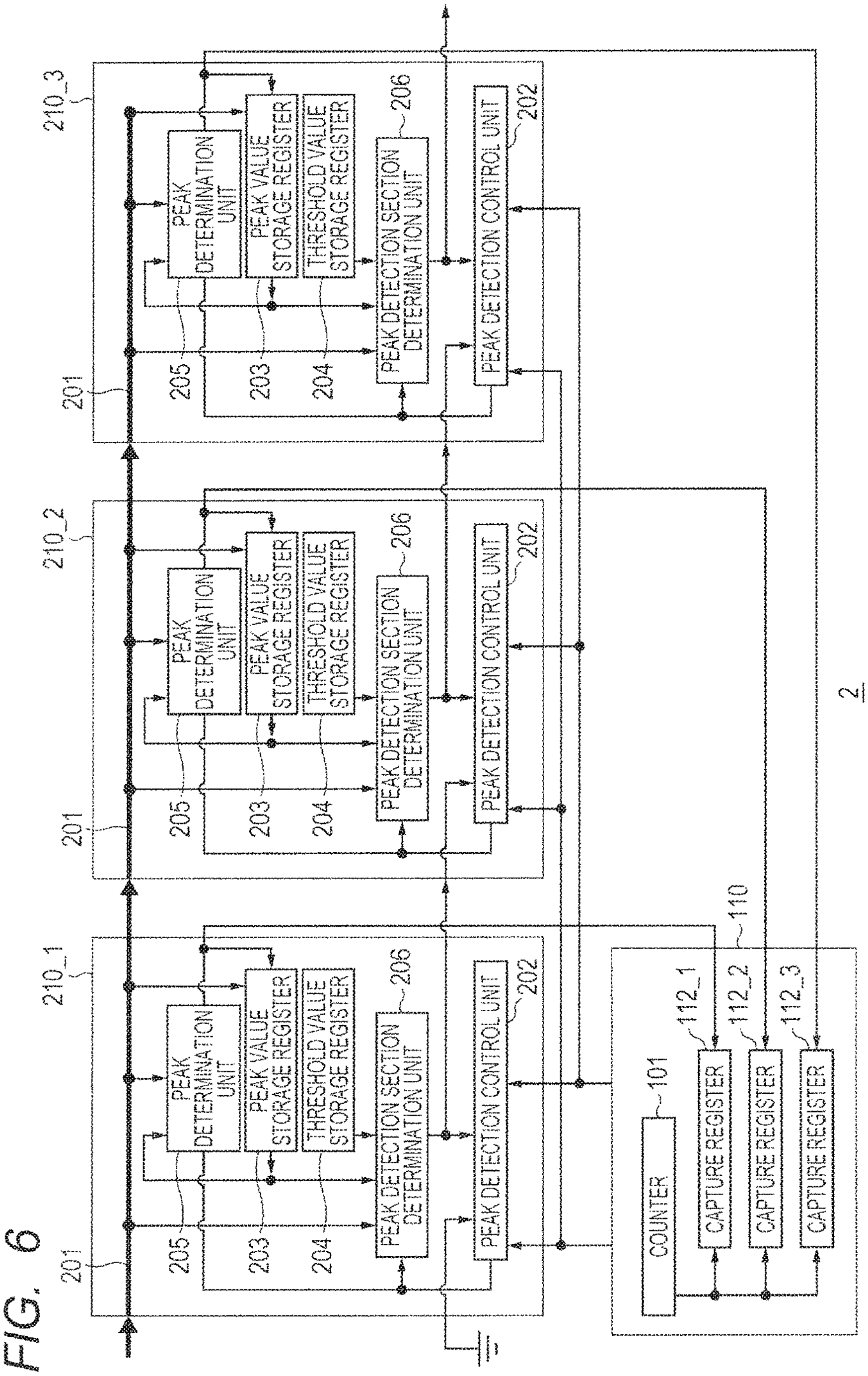
FIG. 6 is a block diagram showing an example of the configuration of a semiconductor device 2 according to a second embodiment.
Figure 7:
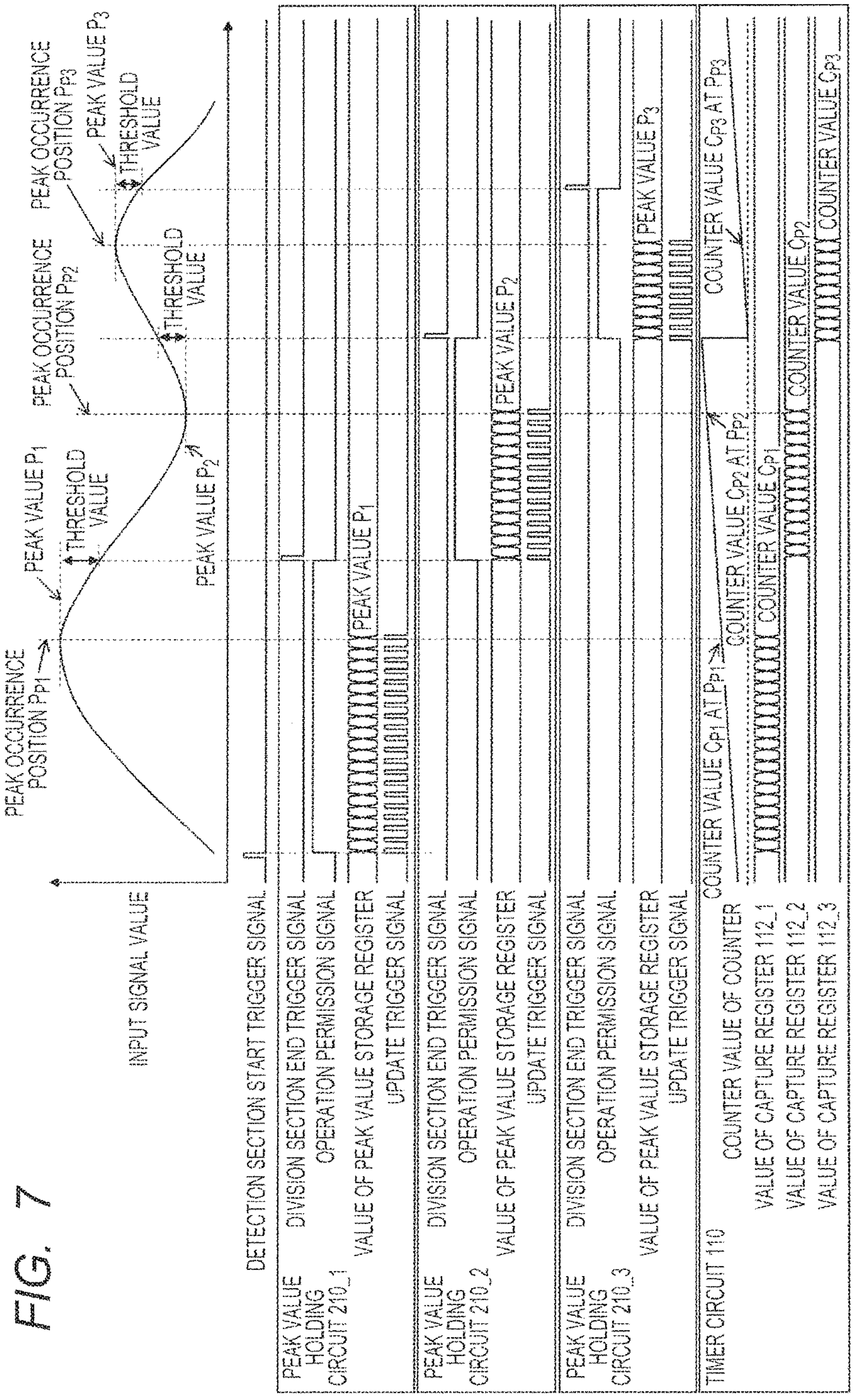
FIG. 7 is a timing chart showing an example of the operation of the semiconductor device 2 according to the second embodiment.

Next, the second embodiment will be described. FIG. 6 is a block diagram showing an example of the configuration of a semiconductor device 2 according to the second embodiment. FIG. 7 is a timing chart showing an example of the operation of the semiconductor device 2 according to the second embodiment. Hereinafter, the semiconductor device 2 will be described with reference to FIGS. 6 and 7.

As shown in FIG. 6, the semiconductor device 2 according to the second embodiment differs from the semiconductor device 1 according to the first embodiment in that the semiconductor device 2 includes N (N is an integer of 2 or more) peak value holding circuits. Hereinafter, only the different configuration and operation of the semiconductor device 2 according to the second embodiment from those of the semiconductor device 1 according to the first embodiment will be described, and the same configuration and operation will not be described. While FIG. 6 shows the configuration of N=3, it is needless to say that this is an example and the configuration is not limited to N=3. Hereinafter, peak value holding circuits 210_1, 210_2, 210_3 are also collectively simply referred to as a peak value holding circuit 210. Further, capture registers 112_1, 112_2, 112_3 are also collectively simply referred to as a capture register 112.

The semiconductor device 2 has a timer circuit 110 and the peak value holding circuits 210_1, 210_2, 210_3.

The timer circuit 110 differs from the timer circuit 100 in that the timer circuit 110 has the respective capture registers 112 for the peak value holding circuits 210. That is, the timer circuit 110 has the N capture registers 112 (timing storage registers) for storing the timing of acquiring the peak value by the N peak value holding circuits 210. The peak determination unit 205 in the nth (n is an integer of 1 or more) peak value holding circuit 210 of the N peak value holding circuits 210 outputs the update trigger signal to the nth capture register 112 of the N capture registers 112. If the update trigger signal is inputted from the peak determination unit 205 in the nth peak value holding circuit 210, the nth capture register 112 updates the storage value to the count value inputted from the counter 101.

More specifically, referring to FIG. 6, the timer circuit 110 has the counter 101 and the capture registers 112_1, 112_2, 112_3. The capture register 112_1 is a register corresponding to the peak value holding circuit 210_1, and the stored value is updated by the update trigger signal from the peak determination unit 205 of the peak value holding circuit 210_1. The capture register 112_2 is a register corresponding to the peak value holding circuit 210_2, and the stored value is updated by the update trigger signal from the peak determination unit 205 of the peak value holding circuit 210_2. Further, the capture register 112_3 is a register corresponding to the peak value holding circuit 210_3, and the stored value is updated by the update trigger signal from the peak determination unit 205 of the peak value holding circuit 210_3. The timer circuit 110 outputs the detection section start trigger signal and the detection section end trigger signal to each peak value holding circuit 210. Accordingly, the peak detection control unit 202 of each peak value holding circuit 210 receives the detection section start trigger signal and the detection section end trigger signal from the timer circuit 110.

Each peak value holding circuit 210 has the input signal line 201, the peak detection control unit 202, the peak value storage register 203, the threshold value storage register 204, the peak determination unit 205, and the peak detection section determination unit 206, like the peak value holding circuit 200. The input signal line 201 is a signal line common to the N peak value holding circuits 210. That is, as shown in FIG. 6, the input signal line 201 of the peak value holding circuit 210_1, the input signal line 201 of the peak value holding circuit 210_2, and the input signal line 201 of the peak value holding circuit 210_3 are coupled in series.

Further, if the peak detection section determination unit 206 in the nth peak value holding circuit 210 of the N peak value holding circuits 210 determines that an end timing has arrived, the peak detection section determination unit 206 transmits a start instruction trigger signal for instructing the start of the operation of the peak determination unit 205 to the (n+1)th peak value holding circuit 210. Then, the peak determination unit 205 of the (n+1)th peak value holding circuit 210 starts the operation in response to the reception of the start instruction trigger signal. For example, if the peak detection section determination unit 206 of the peak value holding circuit 210_1 as the first peak value holding circuit determines that the end timing has arrived, the peak detection section determination unit 206 outputs the division section end trigger signal not only to the peak detection control unit 202 of the peak value holding circuit 210_1 but also to the peak detection control unit 202 of the peak value holding circuit 210_2 as the second peak value holding circuit. That is, the division section end trigger signal outputted from the nth peak value holding circuit 210 to the (n+1)th peak value holding circuit 210 is the start instruction trigger signal for instructing the start of the operation of the peak determination unit 205 of the (n+1)th peak value holding circuit 210.

When the peak detection control unit 202 of the (n+1)th peak value holding circuit 210 receives the division section end trigger signal from the nth peak value holding circuit 210, the peak detection control unit 202 of the (n+1)th peak value holding circuit 210 outputs the operation permission signal to the peak determination unit 205 and the peak detection section determination unit 206 in the (n+1)th peak value holding circuit 210. That is, even if the peak detection control unit 202 of the (n+1)th peak value holding circuit 210 receives the detection section start trigger signal from the timer circuit 110, the peak detection control unit 202 of the (n+1)th peak value holding circuit 210 does not immediately output the operation permission signal to the peak determination unit 205 and the peak detection section determination unit 206.

If the peak detection control unit 202 of the (n+1)th peak value holding circuit 210 receives the detection section start trigger signal and the start instruction trigger signal from the nth peak value holding circuit 210, the peak detection control unit 202 of the (n+1)th peak value holding circuit 210 outputs the operation permission signal to the peak determination unit 205 and the peak detection section determination unit 206. That is, when the peak detection control unit 202 of the (n+1)th peak value holding circuit 210 detects the division section end trigger signal from the nth peak value holding circuit 210 after receiving the detection section start trigger signal, the peak detection control unit 202 of the (n+1)th peak value holding circuit 210 outputs the operation permission signal.

At this time, in the nth peak value holding circuit 210, when the division section end trigger signal is outputted to the peak detection control unit 202 of the nth peak value holding circuit 210, the determination operation of the nth peak value holding circuit 210 is ended. That is, the determination operation of the nth peak value holding circuit 210 is ended, and the determination operation of the (n+1)th peak value holding circuit 210 is started.

When the peak detection control unit 202 of the first peak value holding circuit 210 receives the detection section start trigger signal, the peak detection control unit 202 of the first peak value holding circuit 210 immediately outputs the operation permission signal to the peak determination unit 205 and the peak detection section determination unit 206. Since the division section end trigger signal is not inputted to the peak detection control unit 202 of the peak value holding circuit 210_1 as the first peak value holding circuit 210 from another peak value holding circuit 210, a fixed value (e.g., 0) may be inputted as shown in FIG. 6.

In each peak value holding circuit 210, the end control of the determination operation is performed in the same way as in the peak value holding circuit 200 according to the first embodiment. That is, in each peak value holding circuit 210, the peak detection control unit 202 outputs the operation inhibition signal to the peak determination unit 205 at the timing of occurrence of either the reception of the detection section end trigger signal or the determination of the end timing by the peak detection section determination unit 206.

Thus, in this embodiment as well, it is possible to end the operation of the peak value holding circuit 210 by the detection section end trigger signal. Therefore, it is possible to restrict the operation of the peak value holding circuit 210 within a desired detection section, regardless of the success or failure of peak detection.

Next, referring to FIG. 7, an operation example of the semiconductor device 2 will be described. In FIG. 7, as an example, the peak value holding circuit 210_1 detects the first local maximum value in the peak detection section, the peak value holding circuit 210_2 detects the first local minimum value in the peak detection section, and the peak value holding circuit 210_3 detects the second local maximum value in the peak detection section.

When the detection section start trigger signal is outputted from the timer circuit 110, the peak detection control unit 202 of the peak value holding circuit 210_1 asserts the operation permission signal for the peak determination unit 205 and the peak detection section determination unit 206 in the peak value holding circuit 210_1. Thereby, the peak determination unit 205 and the peak detection section determination unit 206 in the peak value holding circuit 210_1 start the operations. At this time, the peak value holding circuit 210_2 and the peak value holding circuit 210_3 have not yet started the operations.

The update trigger signal is outputted from the peak determination unit 205 of the peak value holding circuit 210_1 until the first peak occurrence position $P_{P1}$ arrives, that is, the value of the input signal of the input signal line 201 becomes the peak value $P_1$. The values of the peak value storage register 203 of the peak value holding circuit 210_1 and the capture register 112_1 are continuously updated while the update trigger signal is outputted. After the first peak occurrence position $P_{P1}$, the peak determination unit 205 of the peak value holding circuit 210_1 does not output the update trigger signal, and the values of the peak value storage register 203 of the peak value holding circuit 210_1 and the capture register 112_1 are not changed. Then, when the value of the input signal further decreases, the division section end trigger signal is outputted from the peak detection section determination unit 206 of the peak value holding circuit 210_1 to the peak detection control unit 202 of the peak value holding circuit 210_1 and the peak detection control unit 202 of the peak value holding circuit 210_2. Thereby, the peak detection control unit 202 of the peak value holding circuit 210_1 negates the operation permission signal for the peak determination unit 205 and the peak detection section determination unit 206 in the peak value holding circuit 210_1. By the above operations, as the detection result of the first peak, the peak value $P_1$ remains stored in the peak value storage register 203 of the peak value holding circuit 210_1, and the count value $C_{P1}$ corresponding to the peak occurrence position $P_{P1}$ remains stored in the capture register 112_1.

Further, when the peak detection control unit 202 of the peak value holding circuit 210_2 receives the division section end trigger signal from the peak value holding circuit 210_1, the peak detection control unit 202 of the peak value holding circuit 210_2 asserts the operation permission signal for the peak determination unit 205 and the peak detection section determination unit 206 in the peak value holding circuit 210_2. Thereby, the peak determination unit 205 and the peak detection section determination unit 206 in the peak value holding circuit 210_2 start the operations. At this time, the peak value holding circuit 210_3 has not yet started the operation.

The update trigger signal is outputted from the peak determination unit 205 of the peak value holding circuit 210_2 until the second peak occurrence position $P_{P2}$ arrives, that is, the value of the input signal of the input signal line 201 becomes the peak value $P_2$. The values of the peak value storage register 203 of the peak value holding circuit 210_2 and the capture register 112_2 are continuously updated while the update trigger signal is outputted. After the second peak occurrence position $P_{P2}$, the peak determination unit 205 of the peak value holding circuit 210_2 does not output the update trigger signal, and the values of the peak value storage register 203 of the peak value holding circuit 210_2 and the capture register 112_2 are not changed. Then, when the value of the input signal further increases, the division section end trigger signal is outputted from the peak detection section determination unit 206 of the peak value holding circuit 210_2 to the peak detection control unit 202 of the peak value holding circuit 210_2 and the peak detection control unit 202 of the peak value holding circuit 210_3. Thereby, the peak detection control unit 202 of the peak value holding circuit 210_2 negates the operation permission signal for the peak determination unit 205 and the peak detection section determination unit 206 in the peak value holding circuit 210_2. By the above operation, as the detection result of the second peak, the peak value $P_2$ remains stored in the peak value storage register 203 of the peak value holding circuit 210_2, and the count value $C_{P2}$ corresponding to the peak occurrence position $P_{P2}$ remains stored in the capture register 112_2.

Further, when the peak detection control unit 202 of the peak value holding circuit 210_3 receives the division section end trigger signal from the peak value holding circuit 210_2, the peak detection control unit 202 of the peak value holding circuit 210_3 asserts the operation permission signal for the peak determination unit 205 and the peak detection section determination unit 206 in the peak value holding circuit 210_3. Thereby, the peak determination unit 205 and the peak detection section determination unit 206 in the peak value holding circuit 210_3 start the operations.

The update trigger signal is outputted from the peak determination unit 205 of the peak value holding circuit 210_3 until the third peak occurrence position $P_{P3}$ arrives, that is, the value of the input signal of the input signal line 201 becomes the peak value $P_3$. The values of the peak value storage register 203 of the peak value holding circuit 210_3 and the capture register 112_3 are continuously updated while the update trigger signal is outputted. After the third peak occurrence position $P_{P3}$, the peak determination unit 205 of the peak value holding circuit 210_3 does not output the update trigger signal, and the values of the peak value storage register 203 of the peak value holding circuit 210_3 and the capture register 112_3 are not changed. Then, when the value of the input signal further decreases, the division section end trigger signal is outputted from the peak detection section determination unit 206 of the peak value holding circuit 210_3 to the peak detection control unit 202 of the peak value holding circuit 210_3. Thereby, the peak detection control unit 202 of the peak value holding circuit 210_3 negates the operation permission signal for the peak determination unit 205 and the peak detection section determination unit 206 in the peak value holding circuit 210_3. By the above operation, as the detection result of the third peak, the peak value $P_3$ remains stored in the peak value storage register 203 of the peak value holding circuit 210_3, and the count value $C_{P3}$ corresponding to the peak occurrence position $P_{P3}$ remains stored in the capture register 112_3.

The semiconductor device 2 according to the second embodiment has been described. The semiconductor device 2 includes a plurality of peak value holding circuits. When the nth peak value holding circuit 210 completes the detection of one peak, this peak value holding circuit 210 outputs the start instruction trigger signal to the (n+1)th peak value holding circuit 210 for starting the detection of the next peak. Therefore, according to the semiconductor device 2, it is possible to acquire the peak value of each of a plurality of peaks. Further, since the capture register 112 is provided for each peak value holding circuit 210, it is also possible to acquire the occurrence position of each acquired peak value.

Third Embodiment

Figure 8:
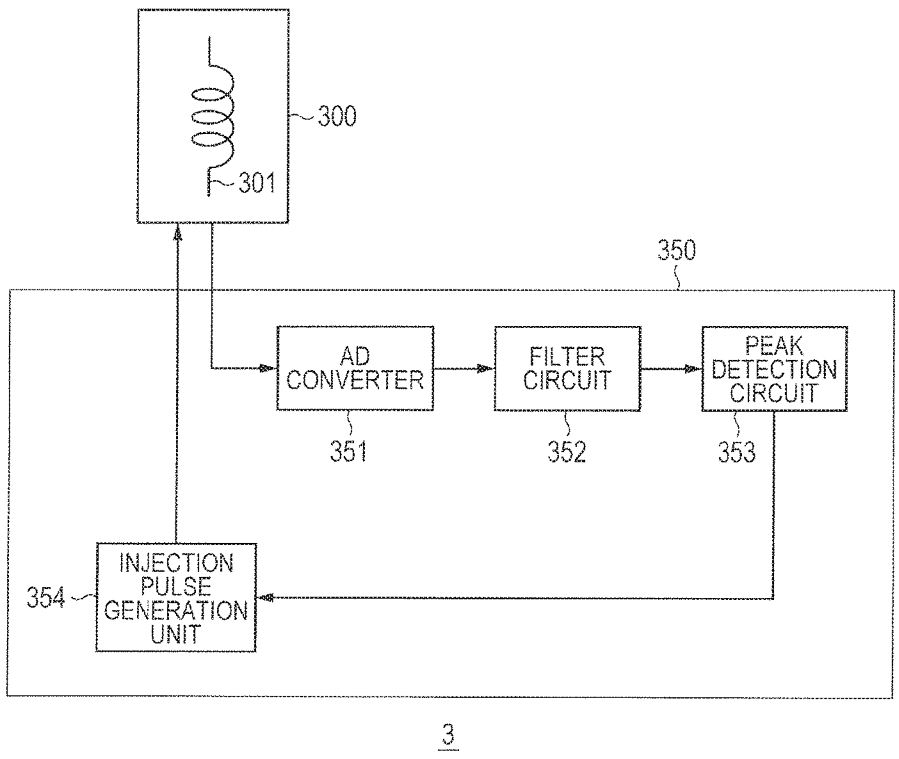
FIG. 8 is a block diagram showing an example of the configuration of a fuel injection device 3 according to a third embodiment.

Next, the third embodiment will be described. The third embodiment shows a fuel injection device using the peak value holding circuit described in the first embodiment or the second embodiment. FIG. 8 is a block diagram showing an example of the configuration of the fuel injection device 3 according to the third embodiment. As shown in FIG. 8, the fuel injection device 3 has an electromagnetic fuel injection valve 300 including a solenoid 301 and an ECU (Engine Control Unit) 350.

The energization of the solenoid 301 is controlled by an injection pulse signal from the ECU 350, so that the electromagnetic fuel injection valve 300 opens/closes the valve. For example, the electromagnetic fuel injection valve 300 operates as follows. In the state of energizing the solenoid 301, magnetic attraction force for attracting a needle existing in the electromagnetic fuel injection valve 300 overcomes the biasing force, the needle and a valve body move, and a valve hole is opened. On the other hand, when the energization of the solenoid 301 is shut off, the magnetic attraction force disappears, the needle and the valve body are biased toward a valve seat by the biasing force of a spring, and the valve hole is closed.

The ECU 350 calculates the timing and time width of fuel injection from the valve hole of the electromagnetic fuel injection valve 300, based on e.g. each information such as an engine speed, an intake air amount, and a temperature, and outputs to the electromagnetic fuel injection valve 300 the injection pulse signal for specifying a valve opening duration from a valve opening start to a valve opening end. The ECU 350 performs feedback control by the configuration shown in FIG. 8. As shown in FIG. 8, the ECU 350 has an AD converter 351, a filter circuit 352, a peak detection circuit 353, and an injection pulse generation unit 354.

The AD converter 351 analog/digital-converts a drive current or a drive voltage for driving the solenoid 301. The filter circuit 352 eliminates noise from a signal outputted from the AD converter 351.

The peak detection circuit 353 detects the peak of a signal outputted from the filter circuit 352. The peak detection circuit 353 may be the semiconductor device 1 according to the first embodiment or the semiconductor device 2 according to the second embodiment. That is, it can be said that the peak detection circuit 353 is the peak value holding circuit to which the drive voltage value or drive current value of the electromagnetic fuel injection valve 300 is inputted as an input signal. It is known that the peak occurs in the drive voltage value or the drive current value when the valve is closed or opened in the electromagnetic fuel injection valve 300. This occurs, for example, when the drive current value or drive voltage value of the solenoid 301 changes with the movement or collision of the needle or the valve body of the electromagnetic fuel injection valve 300. That is, it is possible to grasp the behavior of the electromagnetic fuel injection valve 300 by detecting the peak.

The injection pulse generation unit 354 is, for example, a control unit for performing predetermined control based on the peak value stored in the peak detection circuit 353. This control unit (the injection pulse generation unit 354) is realized, for example, when the processor of the ECU 350 executes a program loaded to a memory of the ECU 350.

The injection pulse generation unit 354 corrects a pulse width, based on the peak value stored in the peak detection circuit 353, and generates an injection pulse signal of the corrected pulse width. Then, the injection pulse generation unit 354 outputs the generated injection pulse signal to the electromagnetic fuel injection valve 300. Thereby, the injection pulse generation unit 354 controls the valve opening/closing operation of the electromagnetic fuel injection valve 300.

According to this embodiment, the peak detection circuit 353 detects the peak, so that it is possible to detect the actual occurrence timing of the valve opening/closing of the electromagnetic fuel injection valve 300. Thereby, it is possible to more accurately control the valve opening/closing. In the case where the peak detection circuit 353 detects a plurality of peaks as in the second embodiment, it is possible to grasp the overall behavior of the electromagnetic fuel injection valve 300. This brings about the following advantage, for example. In the electromagnetic fuel injection valve 300, various components such as the needle and the valve body operate, thereby causing noise such as operation noise. For a sensor that senses the behavior of an element other than the electromagnetic fuel injection valve 300, it is preferable that this noise is eliminated. By the peak detection by the peak detection circuit 353, the occurrence timing of noise by the electromagnetic fuel injection valve 300 is grasped, thereby easily eliminating the noise. Therefore, it is possible to reduce erroneous detection by the sensor.

While the invention made above by the present inventors has been described specifically based on the illustrated embodiments, the present invention is not limited thereto. It is needless to say that various changes and modifications can be made thereto without departing from the spirit and scope of the invention. For example, in the above embodiments, components shown as circuits may be implemented not only by hardware but also by software. That is, some or all of these components may be implemented when a program loaded to a memory is executed by a processor or the like.

Further, the program can be stored using various types of non-transitory computer readable media, and supplied to a computer. The non-transitory computer readable media include various types of tangible storage media. The non-transitory computer readable media include, for example, a magnetic recording medium (e.g., flexible disk, magnetic tape, hard disk drive), a magneto-optical recording medium (e.g., magneto-optical disk), a CD-ROM (Read Only Memory), a CD-R, a CD-R/W, and a semiconductor memory (e.g., mask ROM, PROM (Programmable ROM), EPROM (Erasable PROM), flash ROM, RAM (Random Access Memory)). Further, the program may be supplied to the computer by various types of transitory computer readable media. The transitory computer readable media include, for example, an electric signal, an optical signal, and an electromagnetic wave. The transitory computer readable media can supply the program to the computer via a wired communication channel such as an electric wire and an optical fiber or a wireless communication channel.

What is claimed is:

1. A semiconductor device comprising:

a peak value holding circuit including:

an input signal line through which an input signal is continuously inputted;

a peak value storage register which is coupled to the input signal line and stores a peak value of the input signal;

a peak determination circuit which is coupled to the input signal line, compares a value stored in the peak value storage register with a value of the input signal inputted from the input signal line, and determines based on a comparison result whether or not to update the value stored in the peak value storage register;

a threshold value storage register which stores a predetermined threshold value; and an end timing determination circuit which is coupled to the input signal line, and determines an end timing of an operation of the peak determination circuit, based on the value of the input signal inputted from the input signal line, the value stored in the peak value storage register, and the threshold value stored in the threshold value storage register, wherein the peak determination circuit determines at least either a local maximum value or a local minimum value as a peak value, outputs an update trigger signal for updating the value stored in the peak value storage register to the peak value storage register if the value of the input signal inputted from the input signal line is larger than the value stored in the peak value storage register, in the case of determining the local maximum value as the peak value, outputs the update trigger signal to the peak value storage register if the value of the input signal inputted from the input signal line is smaller than the value stored in the peak value storage register, in the case of determining the local minimum value as the peak value, and ends an operation if the end timing determination circuit determines that an end timing has arrived, wherein if the update trigger signal is inputted from the peak determination circuit, the peak value storage register updates a storage value to the value of the input signal inputted from the input signal line, and wherein the end timing determination circuit determines that the end timing of the operation of the peak determination circuit has arrived if the value of the input signal inputted from the input signal line becomes smaller than a value obtained by decreasing the value stored in the peak value storage register by a value corresponding to the threshold value stored, in the threshold value storage register in the case of determining the local maximum value as the peak value, and determines that the end timing of the operation of the peak determination circuit has arrived if the value of the input signal inputted from the input signal line becomes larger than a value obtained by increasing the value stored in the peak value storage register by the value corresponding to the threshold value stored, in the threshold value storage register in the case of determining the local minimum value as the peak value.

2. The semiconductor device according to claim 1, comprising N (N is an integer of 2 or more) peak value holding circuits, wherein the input signal line is a signal line common to the N peak value holding circuits, wherein if the end timing determination circuit in the nth (n is an integer of 1 or more and less than N) peak value holding circuit of the N peak value holding circuits determines that an end timing has arrived, a start instruction trigger signal for instructing a start of the operation of the peak determination circuit is transmitted to the (n+1)th peak value holding circuit, and wherein the peak determination circuit of the (n+1)th peak value holding circuit starts the operation in response to reception of the start instruction trigger signal.

3. The semiconductor device according to claim 1, further comprising a timer circuit comprising:

a counter; and a timing storage register for storing an acquisition timing of the peak value, wherein the peak determination circuit further outputs the update trigger signal to the timing storage register, and wherein if the update trigger signal is inputted from the peak determination circuit, the timing storage register updates a storage value to a count value inputted from the counter.

4. The semiconductor device according to claim 2, further comprising:

a timer circuit including:

a counter; and

N timing storage registers for storing an acquisition timing of the peak value by the N peak value holding circuits, wherein the nth peak determination circuit further outputs the update trigger signal to the nth timing storage register, and wherein if the update trigger signal is inputted from the nth peak determination circuit, the nth timing storage register updates a storage value to a count value inputted from the counter.

5. The semiconductor device according to claim 1, wherein the peak value holding circuit further comprises a control circuit for controlling a start and an end of the operation of the peak determination circuit, wherein the control circuit receives a detection section start trigger signal for instructing a start of a peak detection section and a detection section end trigger signal for instructing an end of the peak detection section, outputs an operation permission signal to the peak determination circuit if the control circuit receives the detection section start trigger signal, and outputs an operation inhibition signal to the peak determination circuit at a timing of occurrence of either reception of the detection section end trigger signal or determination of an end timing by the end timing determination circuit, and wherein the peak determination circuit starts the operation when the operation permission signal is inputted, and ends the operation when the operation inhibition signal is inputted.

6. The semiconductor device according to claim 2, wherein the N peak value holding circuits each further comprise a control circuit for controlling a start and an end of the operation of the peak determination circuit, wherein the each control circuit receives a detection section start trigger signal for instructing a start of a peak detection section and a detection section end trigger signal for instructing an end of the peak detection section, wherein if the control circuit of the first peak value holding circuit receives the detection section start trigger signal, the control circuit of the first peak value holding circuit outputs an operation permission signal to the peak determination circuit, wherein if the control circuit of the (n+1)th peak value holding circuit receives the detection section start trigger signal and the start instruction trigger signal from the nth peak value holding circuit, the control circuit of the (n+1)th peak value holding circuit outputs an operation permission signal to the peak determination circuit, wherein the each control circuit outputs an operation inhibition signal to the peak determination circuit at a timing of occurrence of either reception of the detection section end trigger signal or determination of an end timing by the end timing determination circuit, and wherein the peak determination circuit starts the operation when the operation permission signal is inputted, and ends the operation when the operation inhibition signal is inputted.

7. The semiconductor device according to claim 1, wherein the threshold value is a ratio value with respect to the value stored in the peak value storage register.

8. A fuel injection device comprising:

an electromagnetic fuel injection valve;

a peak value holding circuit to which a drive voltage value or a drive current value of the electromagnetic fuel injection valve is inputted as an input signal; and a control unit which performs predetermined control based on a peak value stored in the peak value holding circuit, the peak value holding circuit comprising:

an input signal line through which an input signal is continuously inputted;

a peak value storage register which is coupled to the input signal line and stores a peak value of the input signal;

a peak determination circuit which is coupled to the input signal line, compares a value stored in the peak value storage register with a value of the input signal inputted from the input signal line, and determines based on a comparison result whether or not to update the value stored in the peak value storage register;

a threshold value storage register which stores a predetermined threshold value; and an end timing determination circuit which is coupled to the input signal line, and determines an end timing of an operation of the peak determination circuit, based on the value of the input signal inputted from the input signal line, the value stored in the peak value storage register, and the threshold value stored in the threshold value storage register, wherein the peak determination circuit determines at least either a local maximum value or a local minimum value as a peak value, outputs an update trigger signal for updating the value stored in the peak value storage register to the peak value storage register if the value of the input signal inputted from the input signal line is larger than the value stored in the peak value storage register, in the case of determining the local maximum value as the peak value, outputs the update trigger signal to the peak value storage register if the value of the input signal inputted from the input signal line is smaller than the value stored in the peak value storage register, in the case of determining the local minimum value as the peak value, and ends an operation if the end timing determination circuit determines that an end timing has arrived, wherein if the update trigger signal is inputted from the peak determination circuit, the peak value storage register updates a storage value to the value of the input signal inputted from the input signal line, and wherein the end timing determination circuit determines that the end timing of the operation of the peak determination circuit has arrived if the value of the input signal inputted from the input signal line becomes smaller than a value obtained by decreasing the value stored in the peak value storage register by a value corresponding to the threshold value stored in the threshold value storage register, in the case of determining the local maximum value as the peak value, and determines that the end timing of the operation of the peak determination circuit has arrived if the value of the input signal inputted from the input signal line becomes larger than a value obtained by increasing the value stored in the peak value storage register by the value corresponding to the threshold value stored in the threshold value storage register, in the case of determining the local minimum value as the peak value.

* * * * *